United States Patent
Park (10) Patent No.: US 7,586,140 B2
(45) Date of Patent: Sep. 8, 2009

(54) CMOS IMAGE SENSORS INCLUDING PICKUP REGIONS

(75) Inventor: Won-Je Park, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 353 days.

(21) Appl. No.: 11/472,058

(22) Filed: Jun. 21, 2006

(65) Prior Publication Data

US 2007/0023854 A1 Feb. 1, 2007

(30) Foreign Application Priority Data

Jul. 26, 2005 (KR) .................... 10-2005-0068043

(51) Int. Cl.
H01L 31/062 (2006.01)
H01L 31/113 (2006.01)

(52) U.S. Cl. ................ 257/292; 257/E27.133

(58) Field of Classification Search ................ 257/292, 257/E27.133
See application file for complete search history.

(56) References Cited

U.S. PATENT DOCUMENTS 7,282,754 B2 * 10/2007 Lee ..................... 257/292

FOREIGN PATENT DOCUMENTS

| JP | 2002-043557 | 2/2002 |
| KR | 1020030084491 A | 11/2003 |
| KR | 1020030096659 A | 12/2003 |

* cited by examiner

*Primary Examiner*—Howard Weiss
(74) *Attorney, Agent, or Firm*—Myers Bigel Sibley & Sajovec (57) ABSTRACT

A CMOS image sensor includes a field isolation film defining first, second, and third active fields in a substrate having a first conductivity type, a photodiode region in the first active field, the photodiode region having a second conductivity type opposite the first conductivity type, and a floating diffusion region of the second conductivity type in the second active field. A source follower gate is conductively connected with the floating diffusion region and intersects the second active field. First and second source/drain regions of the second conductivity type are provided in the second active field at opposite sides of the source follower gate, and a pickup region is disposed in the third active field. The third active field may be adjacent a portion of the second active field where the first source/drain region or the second source/drain region is located, and the floating diffusion region may be isolated from the first and second source/drain regions.

14 Claims, 11 Drawing Sheets

Fig. 1

(PRIOR ART)

CMOS IMAGE SENSORS INCLUDING PICKUP REGIONS

CROSS-REFERENCE TO RELATED APPLICATION

This patent application claims priority under 35 U.S.C. § 119 to Korean Patent Application No. 10-2005-0068043 filed on Jul. 26, 2005, the disclosure of which is hereby incorporated by reference.

FIELD OF THE INVENTION

The present invention relates to image sensors, and, in particular, to CMOS image sensors and methods of fabricating the same.

BACKGROUND

Image sensors are photoelectrical devices that convert optical images into electrical signals using the light-responsive characteristics of semiconductor materials. A typical example of an image sensor is a charge-coupled device (CCD). A CCD image sensor may require external control signals and clocking operations with large voltage swings to obtain acceptable charge transfer efficiency, which may consume a large amount of electric power. Further, a CCD image sensor may require an additional circuit for adjusting image signals and generating standard video outputs. Thus, a CCD image sensor may be disadvantageous for high-density integration. Due in part to such limits on CCD image sensors, a CMOS image sensor has been proposed as an alternative to CCD image sensors. CMOS image sensors may have low power consumption and/or may be suitable for high density integration.

A CMOS image sensor may be suitable for high-density integration and/or may have low power consumption because a CMOS image sensor may be constructed in a relatively simple structure using well-known CMOS technology. A unit pixel of a CMOS image sensor usually includes a photodiode as a light-sensitive element, and one or more field effect transistors for transferring and outputting charges from the photodiode.

A structure of a unit pixel of a CMOS image sensor has been proposed that includes a source follower transistor, in order to improve the noise characteristics of the device. A pixel with a source follower transistor will be explained with reference to drawings as follows.

Figure 1:
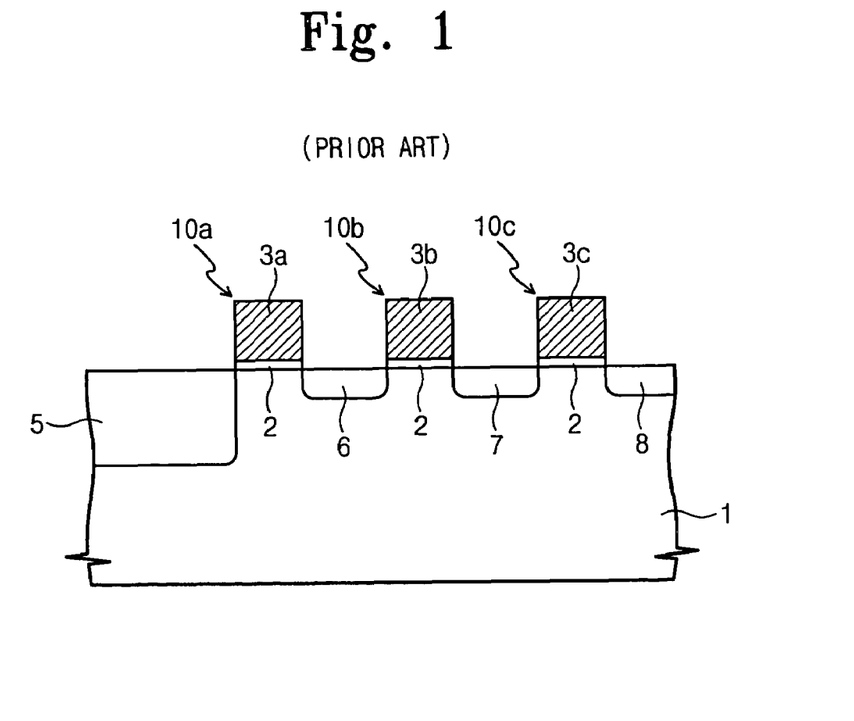
FIG. 1 is a sectional view showing a pixel of a conventional CMOS image sensor.

FIG. 1 is a sectional view showing a pixel of a conventional CMOS image sensor.

Referring to FIG. 1, an N-type photodiode 5 is formed in a P-type semiconductor substrate 1. A transfer gate 3a, a reset gate 3b, and a source follower gate 3c of a corresponding transfer transistor 10a, reset transistor 10b and source follower transistor 10c, respectively, are arranged adjacent the photodiode 5, and are isolated from each other on the semiconductor substrate 1. A gate oxide film 2 is interposed between the gates, 3a, 3b, and 3c, and the semiconductor substrate 1. A floating diffusion region 6 is formed in the semiconductor substrate 1 between the transfer gate 3a and the reset gate 3b. In particular, the transfer gate 3a is disposed on the semiconductor substrate 1 between the photodiode 5 and the floating diffusion region 6. First and second impurity regions 7 and 8 are formed on both sides of the source follower gate 3c in the semiconductor substrate 1. The first impurity region 7 is disposed in the semiconductor substrate 1 between the reset gate 3b and the source follower gate 3c. The floating diffusion region 6, and the first and second impurity regions, 7 and 8, are doped with N-type impurities.

The source follower gate 3c is conductively connected to the floating diffusion region 6 through an upper interconnection (not shown). The floating diffusion region 6 functions as the drain of the reset transistor 10b including the reset gate 3b, and the drain of the source follower transistor 10c including the source follower gate 3c. The first impurity region 7 is supplied with a power source voltage. The second impurity region 8 corresponds to the source of the source follower transistor 10c.

In operation of the CMOS image sensor with the structure shown in FIG. 1, a voltage is applied to the reset gate 3b and the reset transistor 10b is turned on to supply the power source voltage to the floating diffusion region 6 from the first impurity region 7. Thereafter, the reset transistor 10b is turned off to maintain a potential of the floating diffusion region 6 at the power source voltage level.

When light is incident on the photodiode 5, electron-hole pairs (EHPs) are generated and induce signal charges that accumulate in the photodiode 5. The transfer transistor 10a is turned on, which moves electrons into the floating diffusion region 6 from the photodiode 5. Accordingly, the potential of the floating diffusion region 6 varies, which changes the potential of the source follower gate 3c and the potential of the second impurity region 8 (i.e., the source of the source follower transistor 10c). The potential variation at the second impurity region 8 appears as an electric signal at the output terminal of the device. Thereafter, the reset transistor 10b is turned on again to return the floating diffusion region 6 to the power source voltage. These steps may be repeated to transform optical images into electric signals.

As the integration density in semiconductor devices increases, the transistors of a pixel of an image sensor may be gradually shrunk down in dimensions. As a result, hot carrier effects may occur more frequently in the transistors, which may deteriorate the operational characteristics of the CMOS image sensor. For example, hot carrier effects may increase noise, such as dark currents in the CMOS image sensor, degrading the characteristics of the transistors. In particular, the source follower transistor 10c may be susceptible to hot carrier effects. If signal charges (i.e., electrons) accumulate in the floating diffusion region 6, it may decrease the potential applied to the source follower gate 3c, as well as in the source of the source follower transistor 10c (i.e., the second impurity region 8). As a result, the drain of the source follower transistor 10c (i.e., the first impurity region 7) may remain at the level of the power source voltage. Thus, in the source follower transistor 10c, the drain may become higher than the gate in potential, increasing the potential between the drain and the source. As a result, the source follower transistor 10c may become susceptible to hot carrier effects.

The hot carriers may cause impact ionization around the edge of the drain in the source follower transistor 10c, which may result in the generation of excessive numbers of EHPs therein. Excess minority carriers (holes) generated by the hot carriers may accumulate in the semiconductor substrate I and may raise the potential of the substrate 1. As a result, a forward bias may be formed between the semiconductor substrate 1 and the second impurity region 8, increasing the amount of current between the drain and source of the source follower transistor 10c. As a result, the hot carriers may increase, which may further the deterioration of the operational characteristics of the CMOS image sensor. Further, the excess minority carriers (electrons) generated by the hot carriers may flow into the floating diffusion region 6 or/and the photodiode 5, potentially increasing noise, such as dark currents, therein.

SUMMARY

A CMOS image sensor according to some embodiments of the invention includes a field isolation film defining first, second, and third active fields in a substrate having a first conductivity type, a photodiode region in the first active field, the photodiode region having a second conductivity type opposite the first conductivity type, and a floating diffusion region of the second conductivity type in the second active field. A source follower gate is conductively connected with the floating diffusion region and intersects the second active field. First and second source/drain regions of the second conductivity type are provided in the second active field at opposite sides of the source follower gate, and a pickup region is disposed in the third active field. The third active field may be adjacent a portion of the second active field where the first source/drain region or the second source/drain region is located, and the floating diffusion region may be isolated from the first and second source/drain regions.

The pickup region may be doped with impurities of the first conductivity type. The first conductivity type may be P-type and the second conductivity type may be N-type, and the pickup region may be coupled to a ground voltage.

The pickup region may include a first pickup region, and the CMOS image sensor may further include a fourth active field defined by the field isolation film adjacent a side of the second active field where the first source/drain region or the second source/drain region may be located, and a second pickup region in the fourth active field. The second pickup region may be doped with impurities of the second conductivity type and may be isolated from the first and second source/drain regions.

The first conductivity type may be P-type and the second conductivity type may be N-type. The first pickup region may be coupled to a ground voltage, and the second pickup region may be coupled to a power supply voltage.

The pickup region may be doped with impurities of the second conductivity type. The first conductivity may be P-type, the second conductivity may be N-type, and the pickup region may be supplied with a power supply voltage.

The CMOS image sensor may further include a transfer gate intersecting the second active field between the photodiode region and the floating diffusion region, and a reset gate intersecting the second active field between the floating diffusion region and the first source/drain region.

The CMOS image sensor may further include a gate insulation film interposed between the transfer gate and the substrate, the reset gate and the substrate, and the source follower gate and the substrate. The first pickup region may be isolated from the first and second source/drain regions. The first source/drain region may be supplied with a power source voltage.

Methods of fabricating a CMOS image sensor according to some embodiments of the invention include forming a field isolation film defining first, second, and third active fields in a substrate having a first conductivity type, forming a transfer gate, a reset gate and a source follower gate, the transfer gate intersecting the second active field adjacent to the first active field, and the reset and source follower gates intersecting the second active field at a side of the transfer gate, and forming a photodiode region of a second conductivity type opposite the first conductivity type in the first active field. Impurities of the second conductivity type may be selectively implanted into the second active field to form a floating diffusion region between the transfer and reset gates, and first and second source/drain regions at opposite sides of the source follower gate. Impurities may be selectively implanted into the third active field to form a pickup region. The third active field may be adjacent a portion of the second active field where the first source/drain region or the second source/drain region is formed, and the source follower gate may be conductively connected to the floating diffusion region.

The pickup region may be doped with impurities of the first conductivity type. The first conductivity type may be P-type, the second conductivity type may be N-type, and the pickup region may be coupled to a ground voltage.

The pickup region may include a first pickup region, and the field isolation film may further define a fourth active field adjacent the portion of the second active field where the first source/drain region or the second source/drain region is formed. The methods may further include implanting impurities of the second conductivity type into the fourth active field to form a second pickup region. The second pickup region may be isolated from the first and second source/drain regions.

The first conductivity may be P-type, the second conductivity may be N-type, the first pickup region may be coupled to a ground voltage, and the second pickup region may be coupled to a power supply voltage.

The pickup region may be doped with impurities of the second conductivity type. The first conductivity may be P-type, the second conductivity type may be N-type, and the pickup region may be coupled to a power supply voltage.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIGS. 7A through 9A are plan views illustrating operations for fabricating a CMOS image sensor in accordance with some embodiments of the invention; and FIGS. 7B through 9B are sectional views taken along with the lines V-V' and VI-VI' of FIGS. 7A through 9A.

DETAILED DESCRIPTION OF EMBODIMENTS OF THE INVENTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including"when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

Exemplary embodiments of the invention will be described with respect to a unit pixel of a CMOS image sensor that includes four transistors. However, the invention is not limited to unit pixels including four transistors. Rather, it should be understood that the invention may be applicable to pixels having other numbers of transistors therein.

Figure 2:
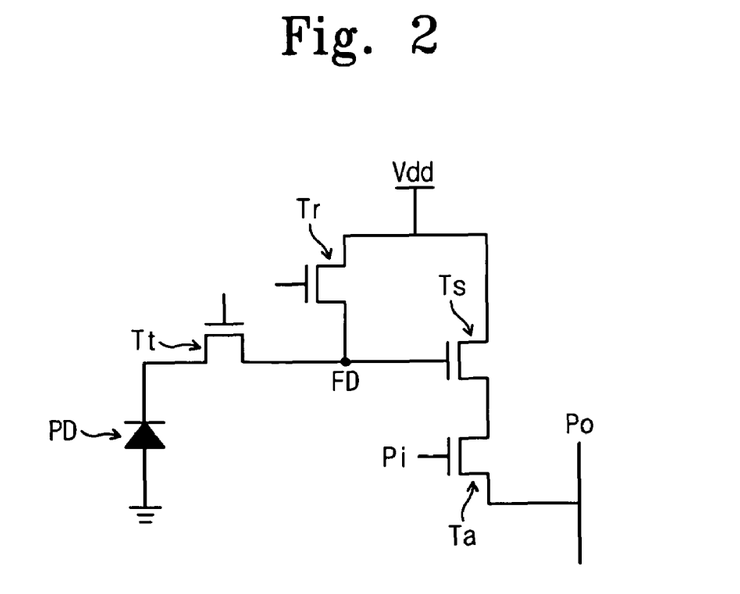
FIG. 2 is an equivalent circuit illustrating a pixel of a CMOS image sensor in accordance with some embodiments of the invention.

FIG. 2 is an equivalent circuit illustrating a pixel of a CMOS image sensor in accordance with some embodiments of the invention.

Referring to FIG. 2, the pixel of the CMOS image sensor includes a photodiode PD as a photo-receiving element, a transfer transistor Tt, a reset transistor Tr, a source follower transistor Ts, and an access transistor Ta, for controlling transmission and output signals with charges and signals from the photodiode PD. The source of the transfer transistor Tt is connected to the photodiode PD. The drain of the transfer transistor Tt is connected to a floating diffusion region FD. The gate of the transfer transistor Tt may be supplied with a voltage for conduction.

The gate of the source follower transistor Ts is coupled to the floating diffusion region FD. The drain of the source follower transistor Ts is coupled to a power source voltage Vdd, and the source of the source follower transistor Ts is connected with the drain of the access transistor Ta.

The source of the reset transistor Tr is connected with the floating diffusion region FD and the drain of the reset transistor Tr is coupled to the power source voltage Vdd. The source of the access transistor Ta is connected to an output port Po and the gate of the access transistor Ta is coupled with an input port Pi. When a voltage capable of turning the access transistor Ta on is applied through the input port Pi, an electric signal having information about an input image is generated through the output port Po. The turn-on voltages applied to the input port Pi, the gate of the transfer transistor Tt, and the gate of the reset transistor Tr may be same as or near to the level of the power source voltage Vdd.

As shown in the equivalent circuit of FIG. 2, the transistors of the pixel (i.e., unit pixel) may be implemented using NMOS transistors. In this case, the power source voltage Vdd is set at a positive voltage level. If the transistors of the pixel are implemented with PMOS transistors, the voltages for operating the pixel may be different from those for the pixel shown in FIG. 2. Namely, if the transistors of the pixel circuit are PMOS transistors, the power source voltage Vdd may be set at a negative voltage level.

While the pixel circuit shown in FIG. 2 is implemented using NMOS transistors, a pixel circuit using PMOS transistors may utilize a negative power source voltage.

The structure of a CMOS image sensor according to some embodiments of the invention will be described with reference to the plan and sectional drawings of FIGS. 3 and 4.

Figure 3:
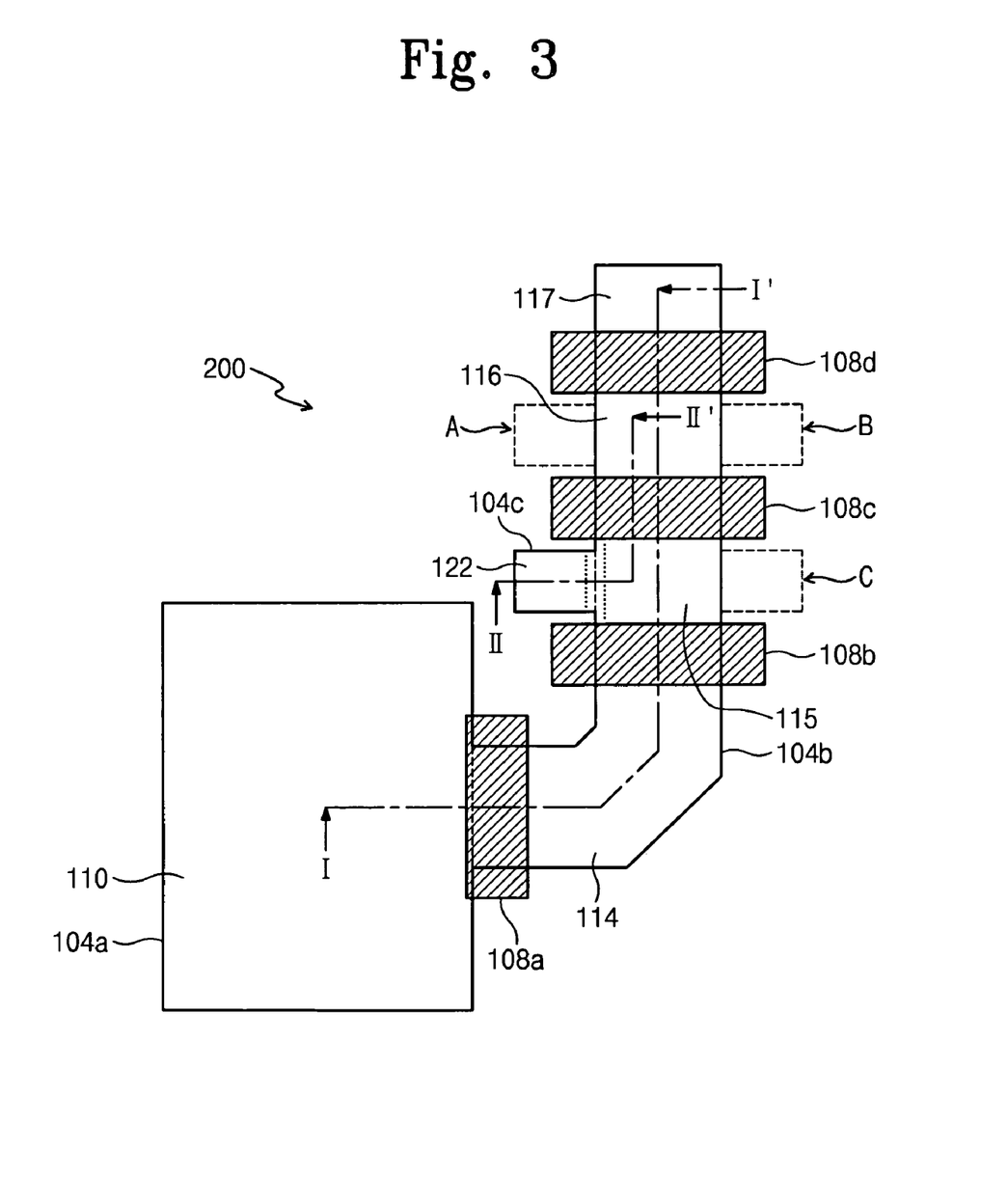
FIG. 3 is a plan view illustrating a CMOS image sensor in accordance with some embodiments of the invention.
Figure 4:
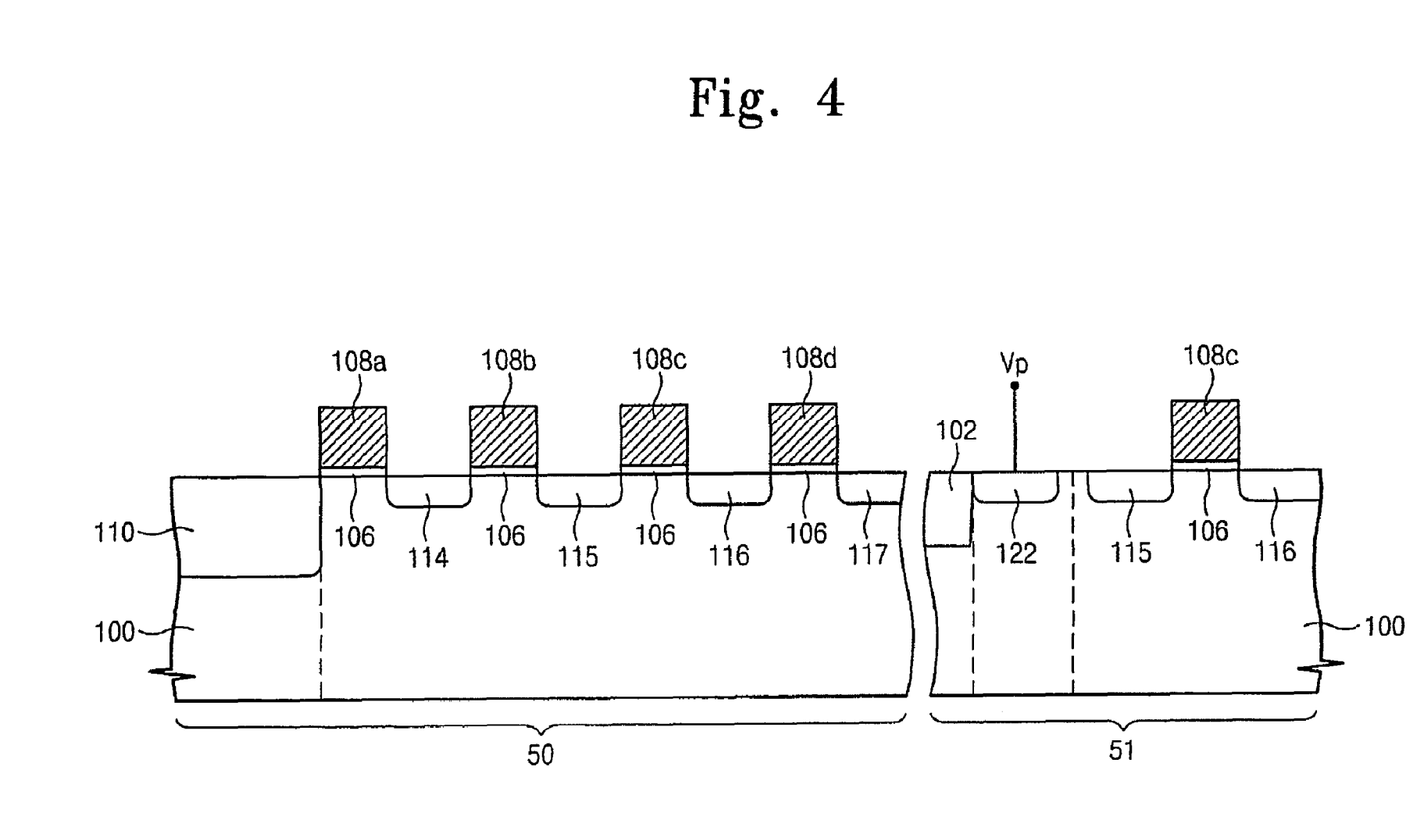
FIG. 4 is a sectional view taken along with the lines I-I' and II-II' of FIG. 3.

FIG. 3 is a plan view illustrating a CMOS image sensor 200 in accordance with some embodiments of the invention, and FIG. 4 is a sectional view taken along with the lines I-I' and II-II' of FIG. 3. In FIG. 4, the reference numerals 50 and 51 correspond to the sections indicated by the lines I-I' and II-II', respectively.

Referring to FIGS. 2, 3, and 4, a field isolation film 102 is arranged to define first, second, and third active fields 104a, 104b, and 104c in a semiconductor substrate 100. The substrate 100 may be doped with impurities of a first conductivity type. Thus, the active fields 104a, 104b, and 104c may be doped with impurities of the first conductivity type. The field isolation film 102 may be implemented, for example, as a trench-type isolation region. The second active field 104b is adjacent to a side of the first active field 104a, while the third active field 104c is adjacent to a side of a portion of the second active field 104b.

A photodiode region 110 is formed in the first active field 104a. At least a portion of the photodiode region 110 is doped with impurities of a second conductivity type, different from the substrate 100. The photodiode region 110 may form a PN junction together with the substrate 100. In some embodiments, the photodiode region 110 may include almost entirely a depletion region.

A transfer gate 108a crosses over the second active field 104b adjacent to the photodiode region 110. At a side of the transfer gate 108a, a floating diffusion region 114 is disposed in the second active field 104b. Namely, the transfer gate 108a is disposed over the second active field 104b between the photodiode 110 and the floating diffusion region 114. The transfer gate 108a may extend to partially cover a portion of the first active field 104a adjacent to the second active field 104b. The transfer gate 108a corresponds to the gate of the transfer transistor Tt, and the floating diffusion region 114 corresponds to the drain of the transfer transistor Tt. The photodiode region 110, which constitutes the photo-receiving element of the pixel 200, acts as the source of the transfer transistor Tt.

A reset gate 108b intersects the second active field 104b, and is spaced from the transfer gate 108a. The floating diffusion region 114 is disposed between the transfer gate 108a and the reset gate 108b. The reset gate 108b functions as the gate of the reset transistor Tr. The floating diffusion region 114 corresponds to the drain of the transfer transistor Tt, and to the source of the reset transistor Tr as well.

A source follower gate 108c crosses over the second active field 104b, and is spaced from the reset gate 108b. The reset gate 108b intersects the second active field 104b between the transfer gate 108a and the source follower gate 108c. At both sides of the source follower gate 108c, first and second source/drain regions 115 and 116 are defined in the second active field 104b, respectively. The first source/drain region 115 is disposed in the second active field 104b between the reset gate 108b and the source follower gate 108c. The second source/drain region 116 is located in the second active field 104b at a side of the source follower gate 108c opposite to the first source/drain region 115. The first and second source/drain regions 115 and 116 may be doped with the second conductivity type impurities. The source follower gate 108c corresponds to the gate of the source follower transistor Ts. The first source/drain region 115 corresponds to the drain of the source follower transistor Ts and the drain of the reset transistor Tr. The second source/drain region 116 functions as the source of the source follower transistor Ts.

The source follower gate 108c is conductively connected to the floating diffusion region 114. In detail, the source follower gate 108c may be lead to the floating diffusion region 114 by way of an interconnection arranged on an interlevel insulation film (not shown) that may cover at least a portion of the substrate 100, and a contact plug (not shown) penetrating the interlevel insulation film. The first source/drain region 115 is supplied with the power source voltage Vdd. If the transistors Tt, Tr, Ts, and Ta are NMOS transistors, the power source voltage Vdd may be set at a positive voltage level. Otherwise, if the transistors Tt, Tr, Ts, and Ta are PMOS transistors, the power source voltage Vdd may be set at a negative voltage level.

An access gate 108d crosses over the second active field 104b, and is spaced from the source follower gate 108c. The source follower gate 108c intersects the second active field 104b between the reset gate 108b and the access gate 108d. The second source/drain region 116 is located in the second active field 104b between the source follower gate 108c and the access gate 108d. At a side of the access gate 108d opposite the second source/drain region 116, a third source/drain region 117 is disposed in the second active field 104b. The second and third source/drain regions 116 and 117 are placed in the second active field 104b at both sides, respectively, of the access gate 108d. The access gate 108d corresponds to the gate of the access transistor Ta. As mentioned above, the second source/drain region 116 may be commonly used as the source of the source follower transistor Ts and the drain of the access transistor Ta. The third source/drain region 117 corresponds to the source of the access transistor Ta. The third source/drain region 117 may be connected with an interconnection used for the output port Po.

A gate insulation film 106 is between the gates 108a-108d and the substrate 100. The gate insulation film 106 may be formed, for example, of silicon oxide. In particular embodiments, the gate insulation film 106 may be a thermal oxide.

The third active field 104c includes a pickup region 122. The pickup region 122 may be doped with the first or second conductivity impurities. The third active field 104c may be disposed adjacent to a side of the portion of the second active field 104b where the first source/drain region 115 and/or the second source/drain region 116 is formed. The pickup region 122 may be isolated from the first and second source/drain regions 115 and 116.

From FIG. 3, it can be seen that the third active field 104c and the pickup region 122 may be disposed at a side of the first source/drain region 115 (see the solid lines in FIG. 3). The third active field 104c and the pickup region 122 may be arranged between the reset gate 108b and the source follower gate 108c. In some embodiments, however, the third active field 104c including the pickup region 122 may be located in the place A, B, or C (see the dotted lines of FIG. 3). In other words, the third active field 104c may be adjacent to a side of the second active field 104b between the reset gate 108b and the source follower gate 108c, or between the source follower gate 108c and the access gate 108d.

The pickup region 122 is supplied with a pickup voltage Vp. The pickup voltage Vp may be applied to the pickup region 122 through an interconnection connected thereto. The pickup voltage Vp contributes to the discharge of excess charges that are generated by hot carriers in the source follower transistor Ts. Thus, the pickup voltage Vp may help to reduce the deterioration of characteristics of the CMOS image sensor due to the excess charges.

The pickup region 122, as mentioned above, may be doped with first or second conductivity type impurities. In other words, the pickup region 122 may be doped to have the same conductivity type as the substrate 100, or the pickup region 122 may be doped to have a conductivity type opposite to that of the substrate 100.

In some embodiments, the pickup region 122 is doped with the first conductivity type impurities (i.e., the same conductivity type as the substrate 100). In that case, excess charges having the same conductivity type as the majority carriers of the substrate 100 can be discharged by way of the pickup region 122. In some embodiments, the first conductivity type may be P-type while the second conductivity may be N-type. That is, the transistors Tt, Tr, Ts, and Ta may be NMOS transistors, in which case the pickup region 122 may be doped with P-type impurities. In that case, the pickup voltage Vp may be a ground voltage. Excess holes induced by hot carrier effects in the source follower transistor Ts may be quickly discharged through the pickup region 122 to which the ground voltage is applied. The excess holes may have the same conductivity type as the majority carriers of the substrate 100. Thus, the deterioration of the CMOS image sensor device characteristics due to excess holes may be reduced. In some embodiments, the P-type impurity concentration of the pickup region 122 may be higher than that of the substrate 100. Thus, it may be possible to reduce a contact resistance between the pickup region 122 and a contact plug connected thereto. As the transistors Tt, Tr, Ts, and Ta share a P-type body field, the excess holes can be quickly discharged by way of the pickup region(122 formed in the pixel even when hot carrier effects are generated from the other transistors Tt, Tr, and Ta.

In other embodiments, the first conductivity type may be N-type while the second conductivity type may be P-type. That is, the transistors Tt, Tr, Ts, and Ta may be PMOS transistors, and the substrate 100 and the pickup region 122 may be doped with N-type impurities. The first source/drain region 1 15 may be supplied with a negative power source voltage Vdd. In this case, the pickup voltage Vp (which may be a ground voltage) may be applied thereto, and excess electrons induced by hot carrier effects may be quickly discharged through the pickup region 122.

In further embodiments, the pickup region 122 may be doped with the second conductivity type impurities (i.e., with the opposite conductivity type as the substrate 100). In that case, excess charges having the same conductivity type as the minority carriers in the substrate 100 can be discharged by way of the pickup region 122. In this case, the first conductivity type may be P-type while the second conductivity type may be N-type. Therefore, the pickup region 122 may be doped with N-type impurities. In addition, the pickup voltage Vp may be the positive power source voltage. Thus, excess electrons induced by hot carrier effects in the source follower transistor Ts may be quickly discharged through the pickup region 122 to which the positive power source voltage is applied. In this case, the excess electrons have the same conductivity type as the minority carriers of the substrate 100. Due to the positive power source voltage, a reverse bias is applied to the PN junction between the substrate 100 and the pickup region 122. At this time, the excess electrons in the substrate 100 migrate into a depletion region of the PN junction between the substrate 100 and the pickup region 122 through diffusion, and then quickly move toward the pickup region 122 by an electric field in the depletion region, and are discharged therethrough. As a result, deterioration of the CMOS image sensor device characteristics due to the excess electrons may be reduced. Also, since the transistors Tt, Tr, Ts, and Ta share a P-type body field, the excess electrons can be quickly discharged by way of the pickup region 122 formed in the pixel even when there are generated due to hot carrier effects in the other transistors Tt, Tr, and Ta.

In some embodiments, the first conductivity type may be N-type while the second conductivity may be P-type. That is, the transistors Tt, Tr, Ts, and Ta may be PMOS transistors. In that case, the pickup region 122 may be doped with P-type impurities while the substrate 100 is doped with N-type impurities. The pickup voltage Vp is set at a negative power source voltage. Accordingly, the excess holes that are present as minority carriers in the substrate 100 may be quickly discharged through the pickup region 122.

As mentioned above, the pickup region 122 may be used to quickly discharge the excess charges (electrons or holes) arising from hot carrier effects, thereby reducing the deterioration of the CMOS image sensor device characteristics due to the excess charges.

While the aforementioned pixel of the CMOS image sensor includes a single pickup region 122, a pixel according to some embodiments of the invention may have more than one pickup region, as described below.

Figure 5:
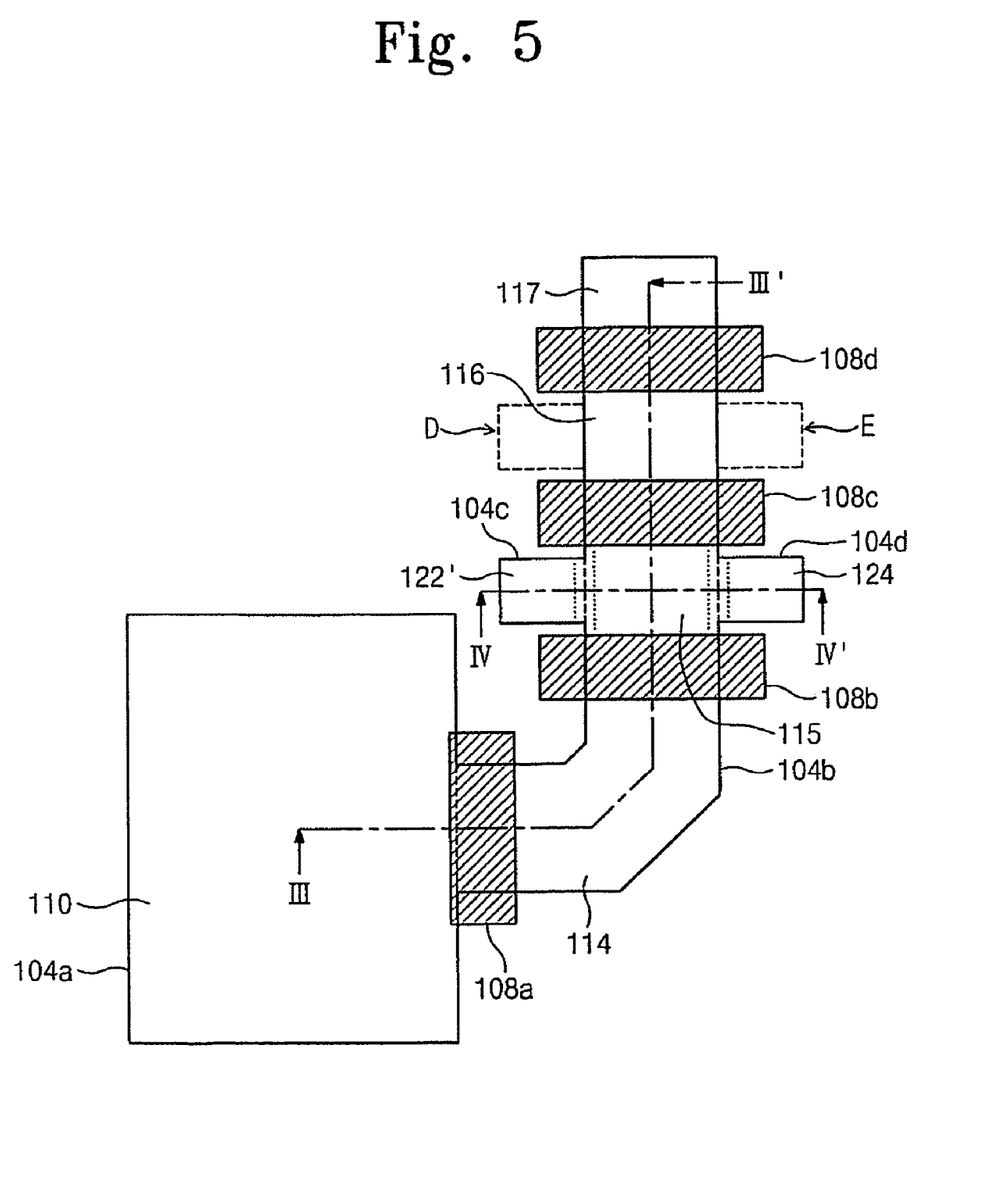
FIG. 5 is a plan view illustrating a CMOS image sensor in accordance with further embodiments of the invention.
Figure 6:
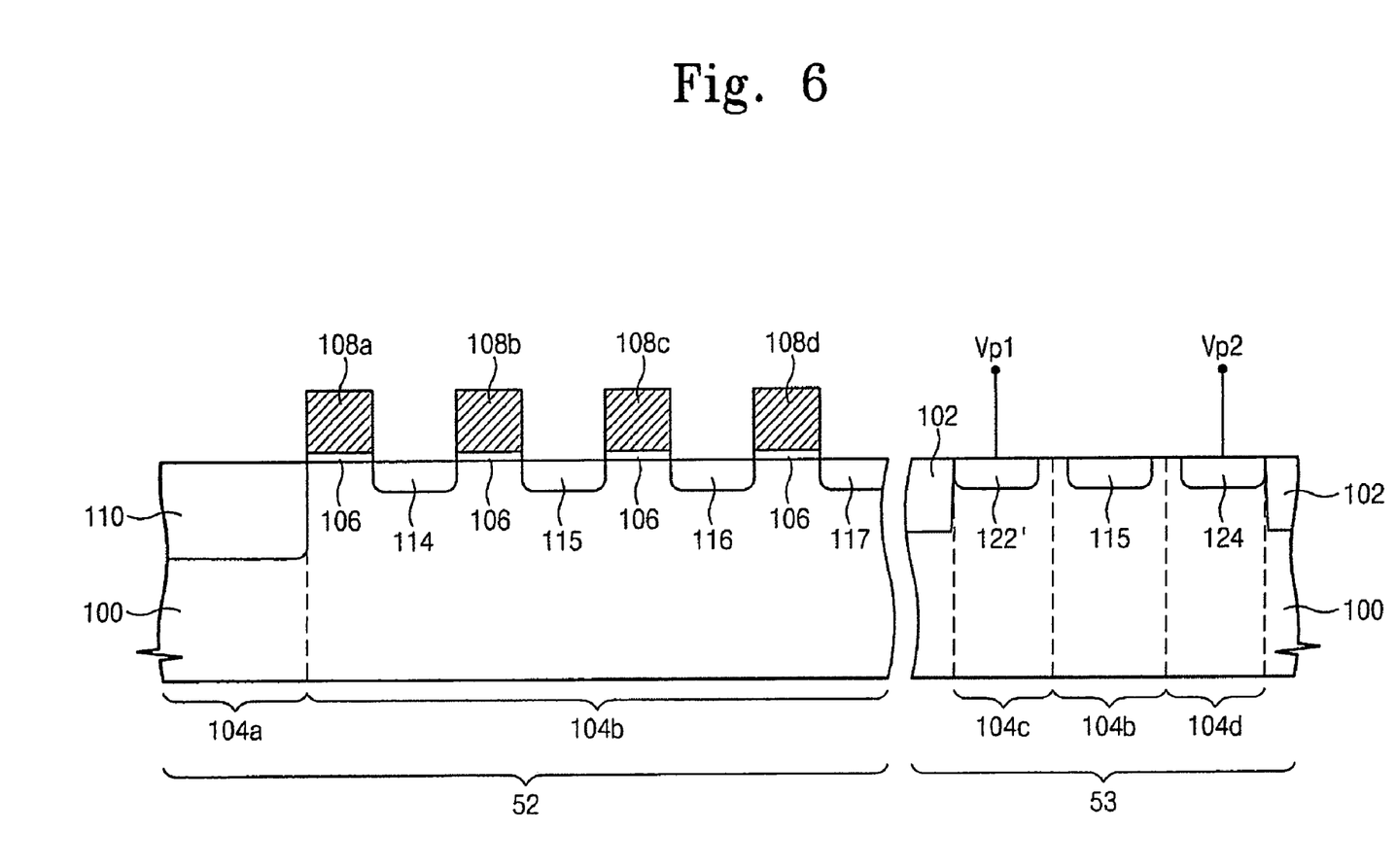
FIG. 6 is a sectional view taken along with the lines III-III' and IV-IV' of FIG. 5.

FIG. 5 is a plan view illustrating a CMOS image sensor in accordance with further embodiments of the invention, and FIG. 6 is a sectional view taken along with the lines III-III' and IV-IV' of FIG. 5.

Referring to FIGS. 2, 5, and 6, a third active field 104c is adjacent to one side of the portion of the second active field 104b where the first source/drain region 115 or the second source/drain region 116 is formed. In addition, a fourth active field 104d is connected to the other side of the portion of the second active field 104b where the first source/drain region 115 or the second source/drain region 115 is formed. In FIG. 5, the third and fourth active fields 104c and 104d are located adjacent to opposite sides of the portion of the second active field 104b where the first source/drain region 115 is formed. However, the third active field 104c may be disposed at the place D or E (see the dotted lines) shown in FIG. 5. And, the fourth active field 104d may be disposed at the place D or E (see the broken lines) shown in FIG. 5. Similarly, the locations of the third and fourth active fields 104c and 104d may be reversed. In other words, the third active field 104c may be connected to a side of the portions of the second active field 104b where the first and second source/drain regions 115 and 116 are located, while the fourth active field 104d may be connected to another of the sides of the portions of the second active field 104b where the first and second source/drain regions 115 and 116 are located.

A first pickup region 122' is disposed in the third active field 104c while a second pickup region 124 is disposed in the fourth active field 104d. The first and second pickup regions 122' and 124 may be isolated from the first and second source/drain regions 115 and 116. The first pickup region 122' may be doped with the first conductivity type impurities while the second pickup region 124 may be doped with the second conductivity type impurities. The first pickup region 122' may be supplied with a first pickup voltage Vp1 while the second pickup region 124 is supplied with a second pickup voltage Vp2.

As the first pickup region 122' is doped with the same conductivity type impurities as same as the substrate 100, excess charges having the same conductivity type as the majority carriers of the substrate 100 may be discharged through the first pickup region 122'. The second pickup region 124 may have a higher impurity concentration than the substrate 100. As the second pickup region 124 is doped with impurities having a conductivity type opposite to that of the substrate 100, excess charges having the same conductivity type as the minority carriers in the substrate 100 may be discharged through the second pickup region 124.

When the first conductivity type is P-type and the second conductivity is N-type, the transistors Tt, Tr, Ts, and Ta are NMOS transistors. In this case, the first and second pickup regions 122' and 124 may be doped with P and N-type impurities, respectively. In that case, the first pickup voltage Vp1 is set at the ground voltage while the second pickup voltage Vp2 is set at the positive power source voltage. Accordingly, when there is a hot carrier effect in the source follower transistor Ts, the excess holes may be quickly discharged through the first pickup region 122' while the excess electrons may be quickly discharged through the second pickup region 124. As the transistors Tt, Tr, Ts, and Ta share a P-type body field, the excess holes can be quickly discharged by way of the first and second pickup regions 122' and 124 even when there are from generated hot carrier effects in the other transistors Tt, Tr, and Ta. As a result, deterioration of the CMOS image sensor device characteristics due to the excess charges resulting from hot carrier effects may be reduced.

Otherwise, when the first conductivity is N-type while the second conductivity is P-type, the transistors Tt, Tr, Ts, and Ta are PMOS transistors. In this case, the first pickup voltage Vp1 is set at the ground voltage while the second pickup voltage Vp2 is set at the negative power source voltage. Accordingly, when there is a hot carrier effect in the source follower transistor Ts, the excess electrons may be quickly discharged through the first pickup region 122', while the excess holes may be quickly discharged through the second pickup region 124.

Next, methods of fabricating a CMOS image sensor according to some embodiments of the invention will be described.

FIGS. 7A through 9A are plan views illustrating procedures for fabricating a CMOS image sensor in accordance with some embodiments of the invention, and FIGS. 7B through 9B are sectional views taken along with the lines V-V' and VI-VI' of FIGS. 7A through 9A, respectively.

Figure 7A:
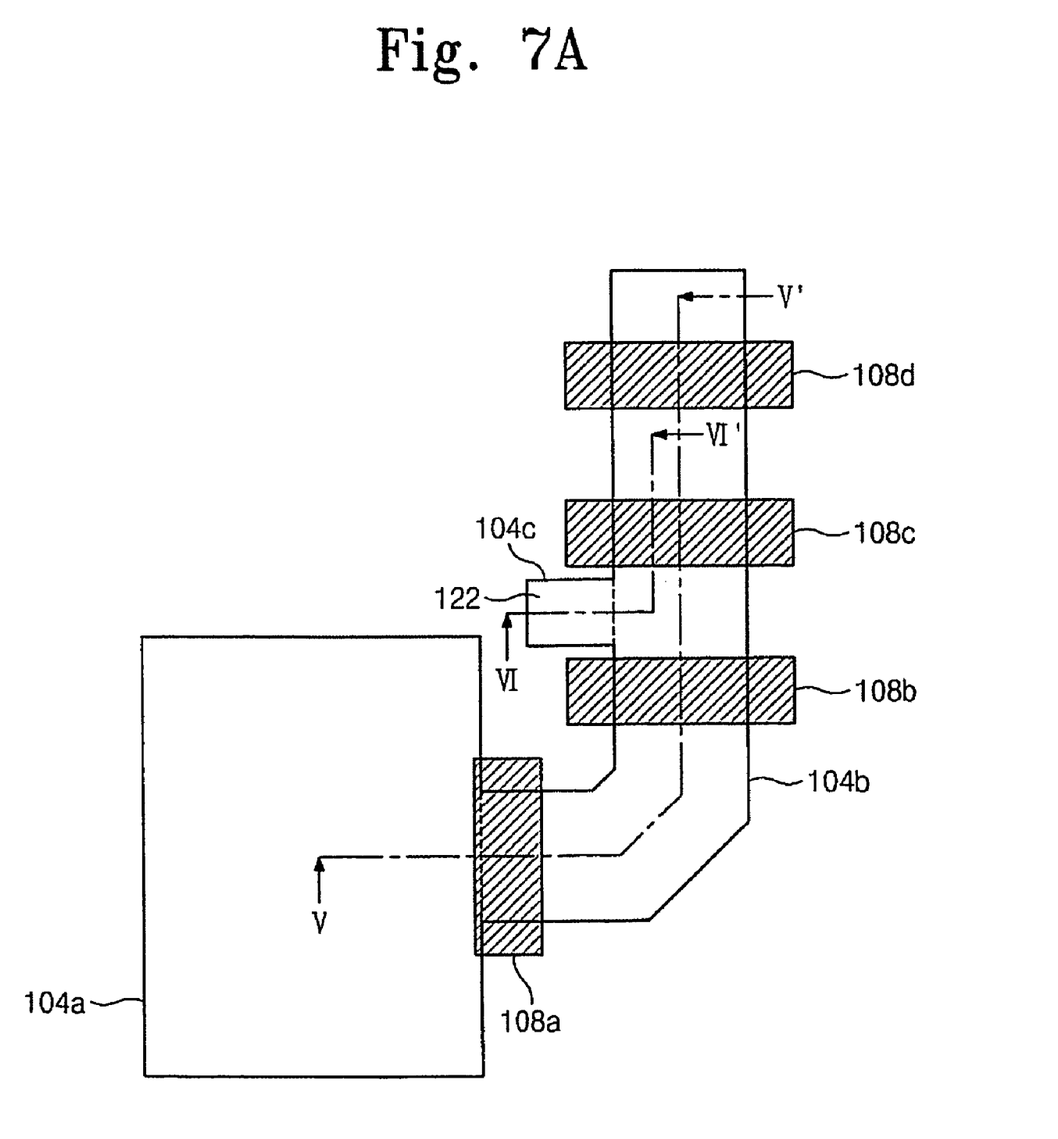
Figure 7B:
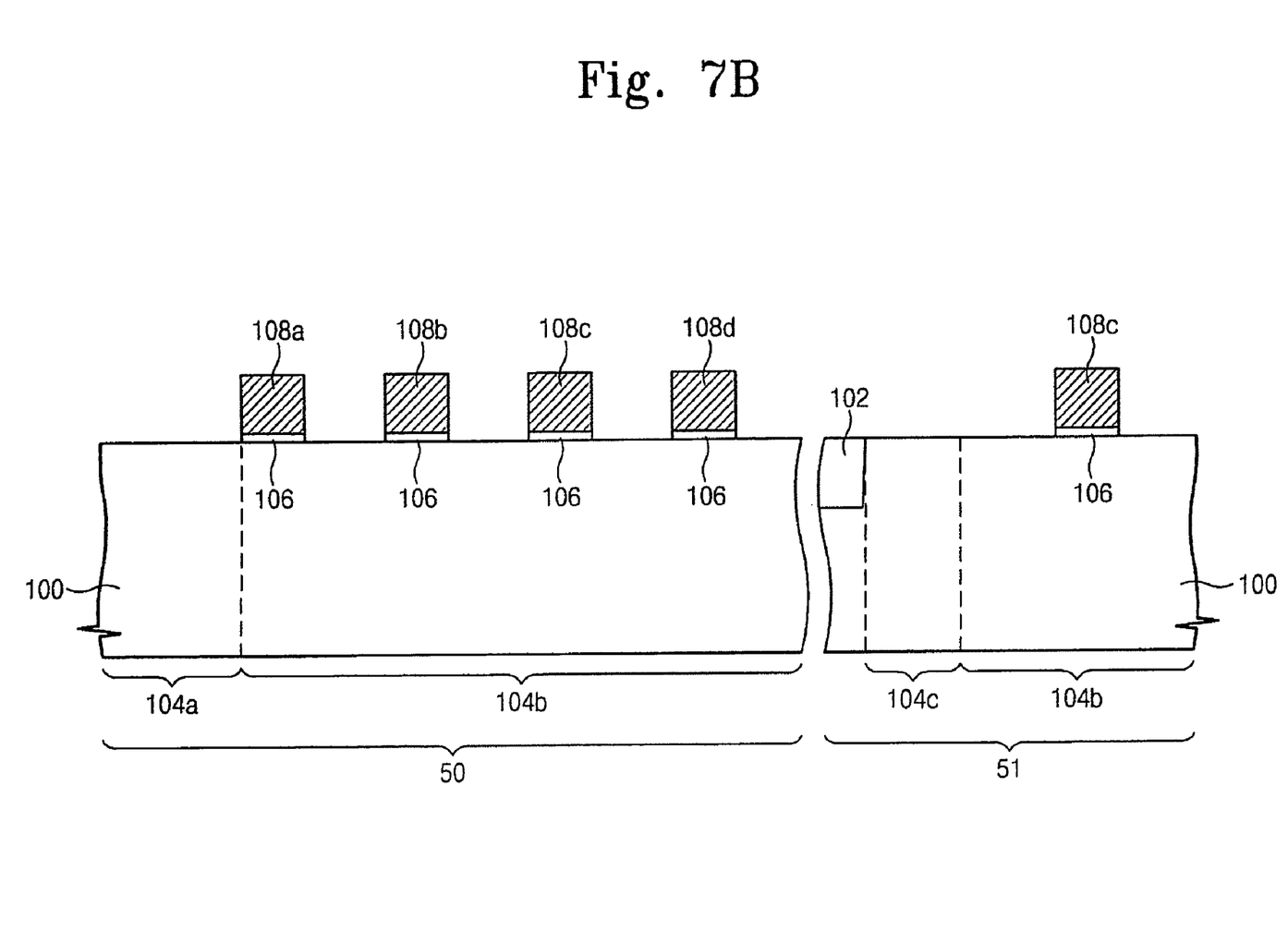

Referring to FIGS. 7A and 7B, a field isolation film 102 is formed in the substrate 100 having the first conductivity type, defining the active fields 104a, 104b, and 104c. The second active field 104b is connected to a side of the first active field 104a and the third active field 104c is connected to a side of a portion of the second active field 104b.

After depositing the-gate insulation film 106 and a gate conductive film on the substrate 100 in sequence, the gate conductive film is patterned to form the transfer, reset, source follower, and access gates 108a~108d. The gate insulation film 106 may be made of silicon oxide, and in particular, may be a thermal oxide. The gate conductive film may be formed of a single layer with doped polysilicon, metal (e.g., tungsten, or molybdenum), conductive metallic nitride (e.g., titanium nitride, or tantalum nitride), or conductive metallic silicide (e.g., tungsten silicide, titanium silicide, nickel silicide, or cobalt silicide), and/or a composite layer of them.

The transfer gate 108a intersects the second active field 104b adjacent to the first active field 104a. The reset, source follower, and access gates, 108b, 108c, and 108d, are sequentially arranged at a side of the transfer gate 108a, intersecting the second active field 104b. The gates 108b, 108c, and 108d, are spaced from each other.

The third active field 104c may be disposed at a side of the second active field 104b between the source follower gate 108c and the reset gate 108b, and/or at a side of the second active field 104b between the source follower gate 108c and the access gate 108d.

Figure 8A:
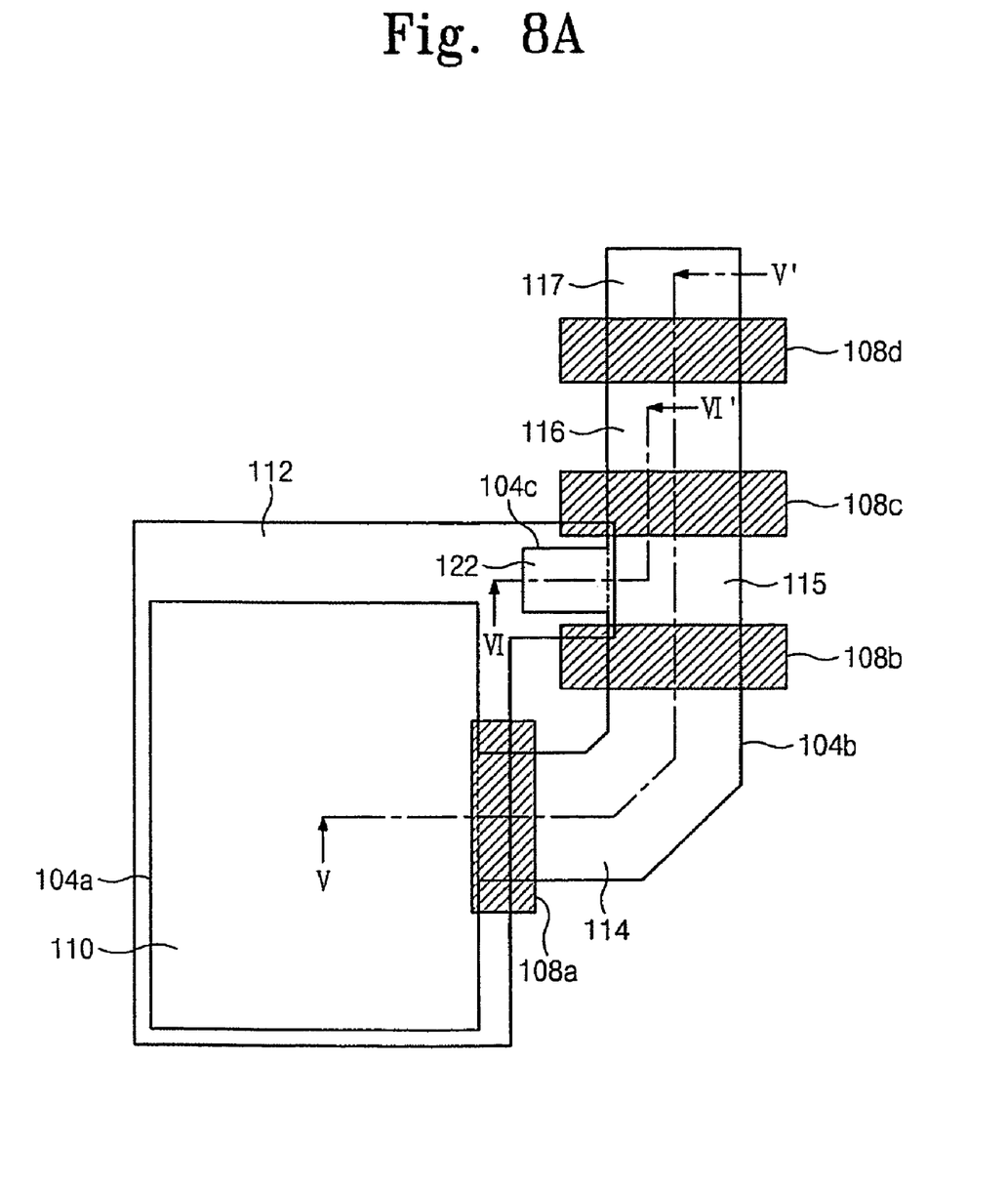
Figure 8B:
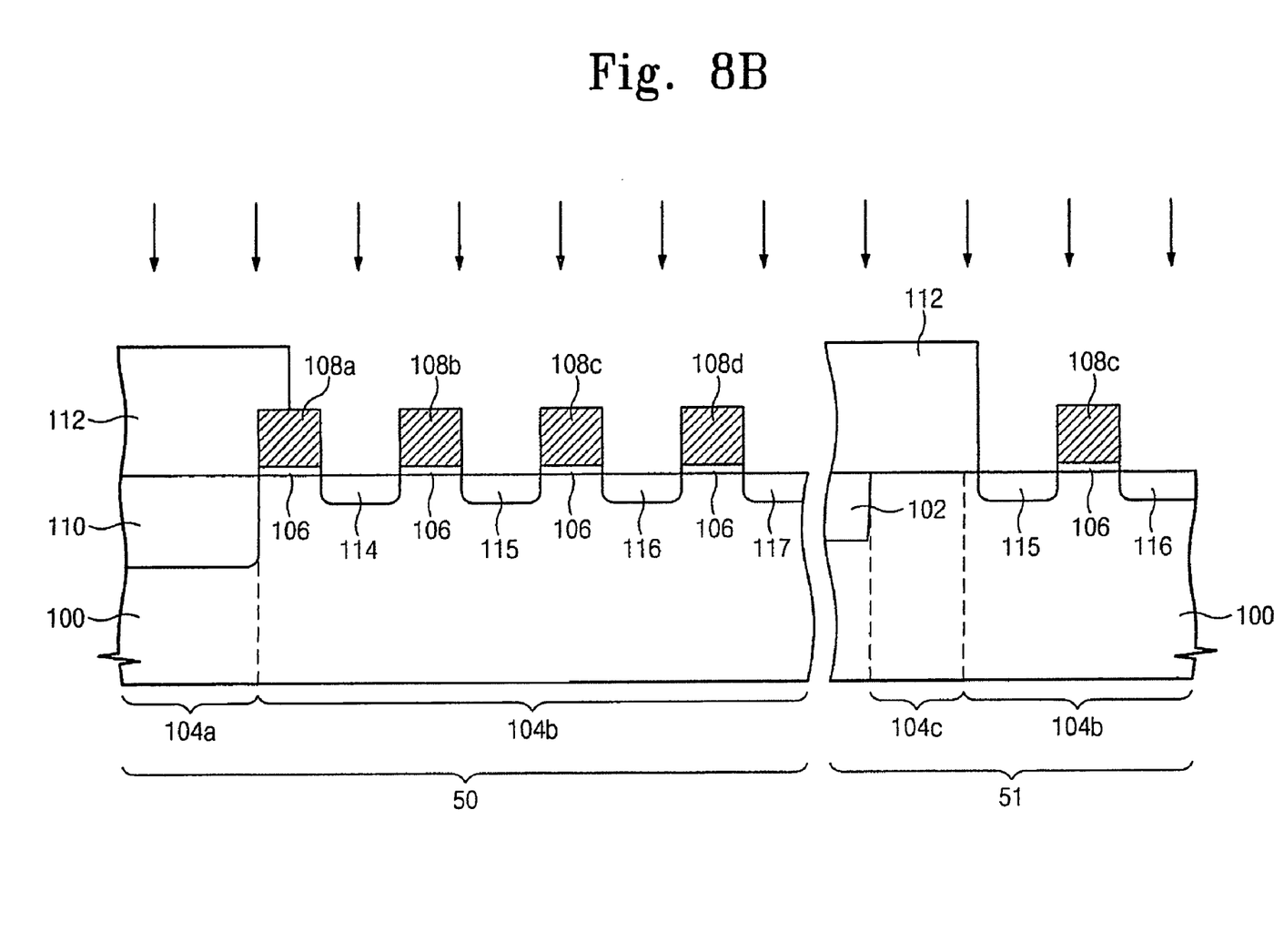

Referring to FIGS. 8A and 8B, impurities of the second conductivity type may be selectively implanted into the first active field 104a, forming the photodiode region 110.

A first mask pattern 112 may be arranged on the substrate 100, covering the photodiode region 110 and the third active field 104c. The first mask pattern 112 may be formed to partially cover the second active field 104b contacting to the third active field 104c.

The first mask pattern 112 may be formed of a photosensitive film. Using the mask structure with the first mask pattern 112 and the gates 108a~108d, second conductivity type impurities may be implanted into the substrate 100, forming the floating diffusion region 114 and the first through third source/drain regions 115~117.

Figure 9A:
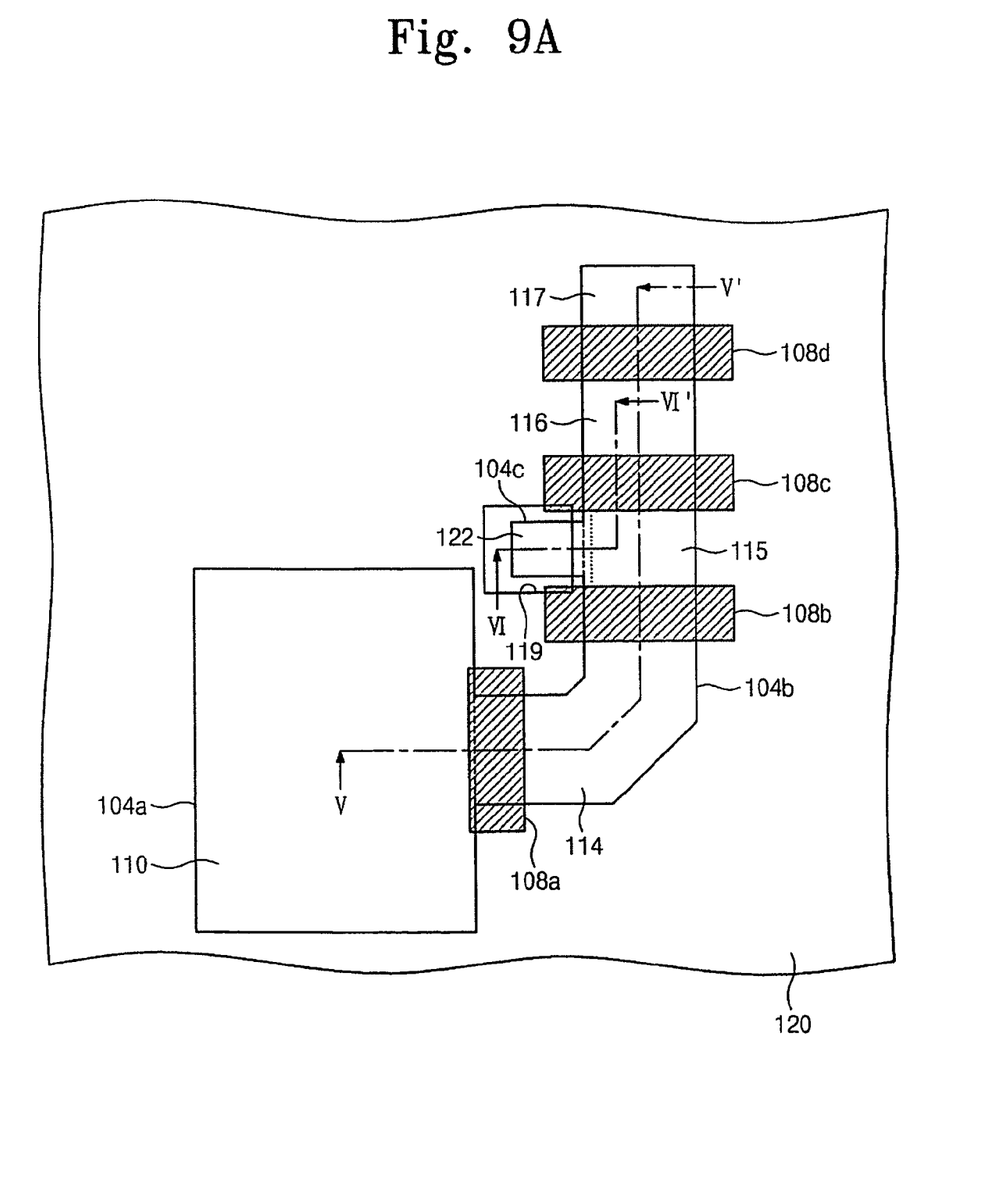
Figure 9B:
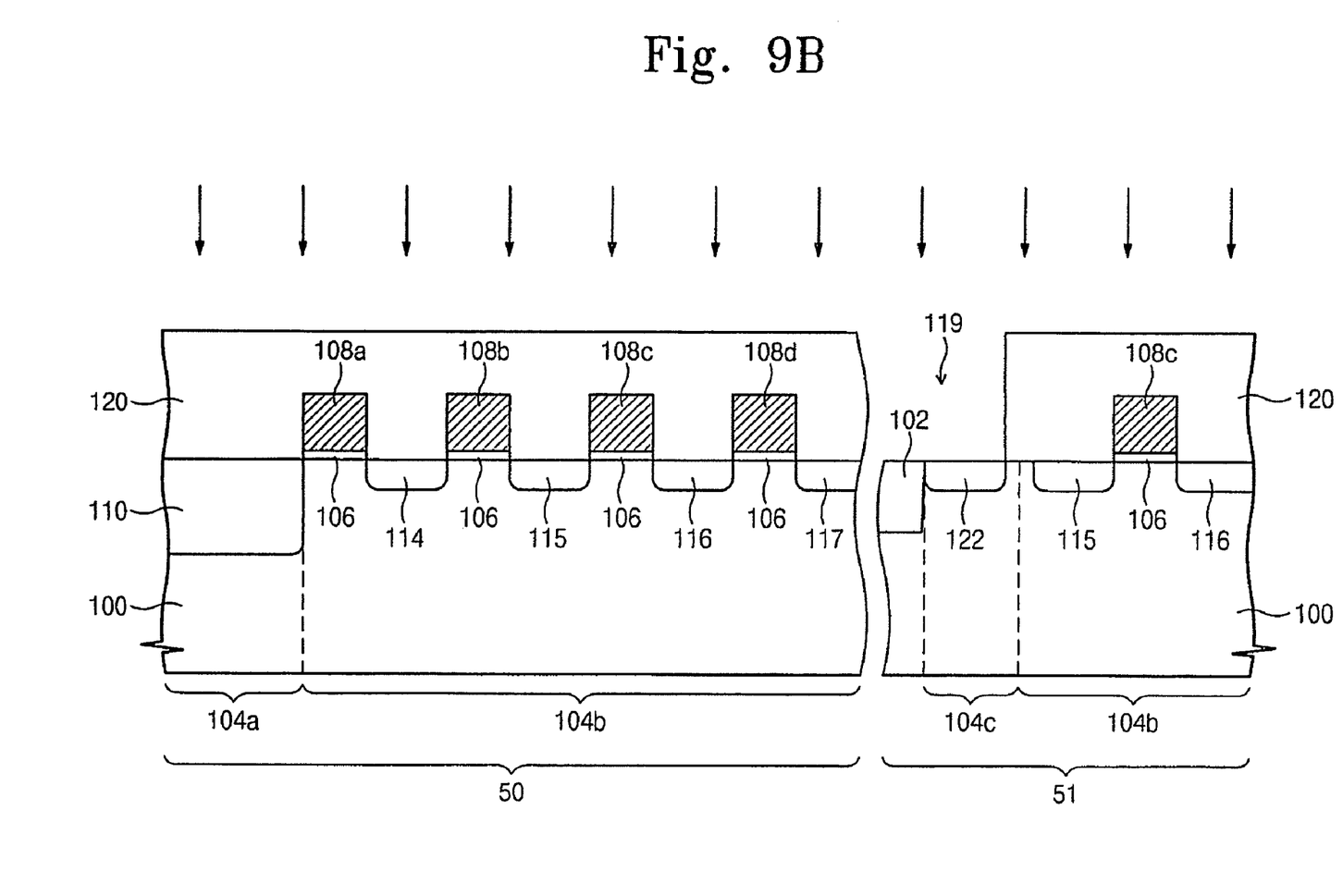

Referring to FIGS. 9A and 9B, after removing the first mask pattern 112, a second mask pattern 120 is formed on the substrate 100. The second mask pattern 120 is arranged to at least partially cover the photodiode region 110, the floating diffusion region 114, and the first through third source/drain regions 115~117. Through the second mask pattern 120, an opening 119 is formed to disclose the third active field 104c. Here, the second mask pattern 120 may cover a part of the third active field 104c which contacts with the second active field 104b.

Using the mask structure with the second mask pattern 120, ionic impurities may be implanted into the substrate 100 to form the pickup region 122 in the third active field 104c. The pickup region 122 may be isolated from the first and second source/drain regions 115 and 116. As mentioned above, since the first mask pattern 112 partially covers the second active field 104b connected with the third active field 104c and the second mask pattern 120 partially covers the third active field 104c connected with the second active field 104b, the pickup region 122 is isolated from the first and second source/drain regions 115 and 116.

As described above in connection with FIGS. 3 and 4, the ionic impurities implanted into the pickup region 122 may include first or second conductivity type impurities.

As stated above, the photodiode region 110, the floating diffusion region 114, the first through third source/drain regions 115~117, and the pickup region 122 may be formed, for example, by selective ion implantation. The sequence of forming the regions may be altered. For instance, it is possible, after forming the floating diffusion region 114 and the first through third source/drain regions 115~117, to form the photodiode region 110 and the pickup region 122 in order. It is also possible, after forming the pickup region 122 at first, to form the photodiode region 110, the floating diffusion region 114, and the first through third source/drain regions 115~117 in order. Other fabrication sequences are possible. Depending on the formation sequence, the mask patterns 112 and 120 may have different configurations.

Methods for fabricating the CMOS image sensor shown in FIGS. 5 and 6 are similar to the procedures illustrated in FIGS. 7A through 9B. In fabricating the CMOS image sensor illustrated in FIGS. 5 and 6, the fourth active field 104d may be formed along with the first through third active fields 104a~104c at the same time. The first pickup region 122' shown in FIGS. 5 and 6 may be formed in the same way as the pickup region 122. The fabrication method for the CMOS image sensor of FIGS. 5 and 6 may further include selectively implanting ionic impurities to form the second pickup region 124. The second pickup region 124 may be formed in the sequence with the first pickup region 122'. For instance, the second pickup region 124 may be formed after forming the first pickup region 122'. In some embodiments, the second pickup region 124 may be formed before forming the first pickup region 122'. Also, in some embodiments, the processing steps of forming the photodiode region 110, forming the floating diffusion region 114 and the first through third source/drain regions 115~117, forming the first pickup region 122', and forming the second pickup region 124 may be carried out in this order, or in other sequences.

As described above, a CMOS image sensor according to some embodiments of the invention includes a pickup region disposed adjacent to one of the first and second source/drain regions located on opposite sides of a source follower gate. As the pickup region is supplied with a pickup voltage, and excess charges caused by hot carrier effects may be quickly discharged through the pickup region. As a result, the deterioration of the CMOS image sensor characteristics due to excess charges may be reduced.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A CMOS image sensor, comprising:
    a field isolation film defining first, second, and third active fields in a substrate having a first conductivity type;
    a photodiode region in the first active field, the photodiode region having a second conductivity type opposite the first conductivity type;
    a floating diffusion region of the second conductivity type in the second active field;
    a source follower gate conductively connected with the floating diffusion region and intersecting the second active field;
    a first source/drain region of the second conductivity type in the second active field at one side of the source follower gate, the first source/drain region being supplied with a power source voltage;
    a second source/drain region of the second conductivity type in the second active field at an opposite side of the source follower gate from the first source/drain region, the second source/drain region being spaced from the first source/drain region, and
    a pickup region in the third active field, the pickup region configured to discharge excess charges generated by hot carriers in a source follower transistor defined by the source follower gate,
    wherein the third active field is protruded from at least one side of the second active field where the first source/drain region or the second source/drain region is located.

2. The CMOS image sensor of claim 1, wherein the pickup region is doped with impurities of the first conductivity type.

3. The CMOS image sensor of claim 2, wherein the first conductivity type is P-type and the second conductivity type is N-type, and the pickup region is coupled to a ground voltage.

4. The CMOS image sensor of claim 2, wherein the pickup region comprises a first pickup region, the CMOS image sensor further comprising:
    a fourth active field defined by the field isolation film adjacent a side of the second active field where the first source/drain region or the second source/drain region is located; and
    a second pickup region in the fourth active field,
    wherein the second pickup region is doped with impurities of the second conductivity type and is isolated from the first and second source/drain regions.

5. The CMOS image sensor of claim 4, wherein the first conductivity type is P-type and the second conductivity type is N-type, the first pickup region is coupled to a ground voltage, and the second pickup region is coupled to a power supply voltage.

6. The CMOS image sensor of claim 1, wherein the pickup region is doped with impurities of the second conductivity type.

7. The CMOS image sensor of claim 6, wherein the first conductivity is P-type, the second conductivity is N-type, and the pickup region is supplied with a power supply voltage.

8. The CMOS image sensor of claim 1, further comprising:
    a transfer gate intersecting the second active field between the photodiode region and the floating diffusion region; and
    a reset gate intersecting the second active field between the floating diffusion region and the first source/drain region.

9. The CMOS image sensor of claim 8, further comprising a gate insulation film interposed between the transfer gate and the substrate, the reset gate and the substrate, and the source follower gate and the substrate.

10. The CMOS image sensor of claim 1, wherein the pickup region is isolated from the first and second source/drain regions.

11. A CMOS image sensor, comprising:
    a filed isolation film defining first, second, and third active fields in a substrate Having a first conductivity type;
    a photodiode region in the first active field, the photodiode region having a second Conductivity tpe;
    a floating diffusion region of the second conductivity type in the second active field;
    a source follower gate conductively connected with the floating diffusion region and Intersecting the second active field;
    first and second source/drain regions of the second conductivity type in the third active field, the pickup region configured to discharge excess charges generated by hot carriers in a source follower transistor defined by the source follower gate,
    wherein the third active field is protruded from a side of the second active field where the source/drain region or the second source/drain region is located.

12. The CMOS image sensor of claim 11, wherein the first conductivity type is P-type and the second conductivity type is N-type, and the pickup region is coupled to a ground voltage.

13. A CMOS image sensor, comprising:
    a field isolation film defining first, second, and third active fields in a substrate having a first conductivity type;
    a photodiode region in the first active field, the photodiode region having a second conductivity type opposite the first conductivity type;
    a floating diffusion region of the second conductivity type in the second active field;
    a source follower gate conductively connected with the floating diffusion region and intersecting the second active field;
    first and second source/drain regions of the second conductivity type in the second active field at opposite sides of the source follower gate; and
    a pickup region doped with impurities of the first conductivity type in the third active field, the pickup region configured to discharge excess charges generated by hot carriers in a source follower transistor defined by the source follower gate,
    wherein the third active field is protruded from a side of the second active field where the first source/drain region or the second source/drain region is located.

14. The CMOS image sensor of claim 13, wherein the first conductivity is P-type, the second conductivity is N-type, and the pickup region is supplied with a power supply voltage.

* * * * *